United States Patent
Smith et al.

[19]

[11] Patent Number: 6,130,152
[45] Date of Patent: *Oct. 10, 2000

[54] AEROGEL THIN FILM FORMATION FROM MULTI-SOLVENT SYSTEMS

[75] Inventors: Douglas M. Smith; Gregory P. Johnston; William C. Ackerman, all of Albuquerque, N. Mex.; Shin-Puu Jeng, Plano; Bruce E. Gnade, Dallas, both of Tex.

[73] Assignee: Texas Instruments Incorporated, Dallas, Tex.

[*] Notice: This patent is subject to a terminal disclaimer.

[21] Appl. No.: 08/746,679

[22] Filed: Nov. 14, 1996

Related U.S. Application Data

[60] Provisional application No. 60/006,853, Nov. 16, 1995.

[51] Int. Cl.$^7$ .................................................. H01L 21/316
[52] U.S. Cl. .......................... 438/622; 438/623; 438/624; 438/790
[58] Field of Search ...................................... 438/622, 623, 438/624, 790, 782; 427/245, 246; 148/DIG. 118

[56] References Cited

U.S. PATENT DOCUMENTS

| | | | |
|---|---|---|---|
| 4,713,233 | 12/1987 | Marsh et al. | 423/608 |
| 4,954,327 | 9/1990 | Blount | 423/338 |
| 5,207,814 | 5/1993 | Cogliati et al. | 65/18.3 |
| 5,242,647 | 9/1993 | Poco | 264/225 |
| 5,275,796 | 1/1994 | Tillotson et al. | 423/338 |

(List continued on next page.)

FOREIGN PATENT DOCUMENTS

| | | |
|---|---|---|
| 90200271 | 2/1990 | European Pat. Off. . |
| 0 382 310 A2 | 8/1990 | European Pat. Off. . |
| 91200939 | 4/1991 | European Pat. Off. . |
| 0 454 239 A2 | 10/1991 | European Pat. Off. . |
| WO 92/03378 | 3/1992 | WIPO . |
| 92/03378 | 5/1992 | WIPO . |

OTHER PUBLICATIONS

V.S. Klimenko, L.A. Kulik, and V.V. Vashchinskaya, *Dependence of the Composition and Structure of Silicic Acid Xerogels on the Nature of the Solvent*, 1986, Ukrainskii Khimicheskii Zhurnal, vol. 52, No. 12, pp. 1247–1251.

Norges Tekniske Hogskole, *Preparation and Charaterization of Transparent, Monolithic Silica Xerogels With Low Density*, Jan. 1993.

D. Basmadjian, G. N. Fulford, B.I. Parsons, and D.S. Montgomery, *The Control of the Pore, Volume and Pore Size Distribution in Alumina and Silica Gels by the Addition of Water Soluble Organic Polymers* Dec. 1962, Journal of Catalysis, vol. 1, No. 6, pp. 547–563.

H. Yokogawa, M. Yokoyama, *Hydrophobic Silica Aerogels*, Journal of Non–Crystalline Solids 186 (1995) 23–29.

Primary Examiner—Charles Bowers
Assistant Examiner—Matthew Whipple
Attorney, Agent, or Firm—David Denker; Carlton H. Hoel; Frederick J. Telecky, Jr.

[57] ABSTRACT

This invention pertains generally to precursors and deposition methods suited to aerogel thin film fabrication. An aerogel precursor sol which contains an oligomerized metal alkoxide (such as TEOS), a high vapor pressure solvent (such as ethanol) and a low vapor pressure solvent (such as water and 1-butanol) is disclosed. By a method according to the present invention, such a precursor sol is applied as a thin film to a semiconductor wafer, and the high vapor pressure solvent is allowed to evaporate while evaporation of the low vapor pressure solvent is limited, preferably by controlling the atmosphere adjacent to the wafer. The reduced sol is then allowed to gel at a concentration determined by the ratio of metal.alkoxide to low vapor pressure solvent. One advantage of the present invention is that it provides a stable, spinnable sol for setting film thickness and providing good planarity and gap fill for patterned wafers. In addition, however, the reduced sol may be gelled rapidly from a known sol concentration keyed to the desired final density of the aerogel thin film and largely independent of film thickness and spin conditions.

10 Claims, 2 Drawing Sheets

U.S. PATENT DOCUMENTS

| | | | |
|---|---|---|---|
| 5,294,480 | 3/1994 | Mielke et al. | 428/240 |
| 5,391,364 | 2/1995 | Cogliati | 423/335 |
| 5,409,683 | 4/1995 | Tillotson et al. | 423/338 |
| 5,470,802 | 11/1995 | Gnade et al. | 437/238 |
| 5,472,913 | 12/1995 | Havemann et al. | 437/195 |
| 5,488,015 | 1/1996 | Havemann et al. | 437/195 |
| 5,494,858 | 2/1996 | Gnade et aql. | 437/231 |
| 5,496,527 | 3/1996 | Yokogawa et al. | 423/338 |
| 5,504,042 | 4/1996 | Cho et al. | 437/247 |
| 5,523,615 | 6/1996 | Cho et al. | 257/632 |
| 5,525,857 | 6/1996 | Gnade et al. | 313/309 |
| 5,536,965 | 7/1996 | Beratan et al. | 257/444 |
| 5,548,159 | 8/1996 | Jeng | 257/634 |
| 5,561,318 | 10/1996 | Gnade et al. | |
| 5,736,425 | 4/1998 | Smith et al. | 438/778 |
| 5,746,992 | 5/1998 | Yoldas et al. | 423/338 |
| 5,753,305 | 5/1998 | Smith et al. | 427/335 |
| 5,807,607 | 9/1998 | Smith et al. | 427/96 |

AEROGEL THIN FILM FORMATION FROM MULTI-SOLVENT SYSTEMS

This application claims priority under 35 USC § 119(e)(1) of provisional application Ser. No. 60/006,853, filed Nov. 16, 1995.

FIELD OF THE INVENTION

This invention pertains generally to precursors and deposition methods for low dielectric constant thin films on semiconductor substrates, and more particularly to such precursors and deposition methods suited to aerogel thin film fabrication.

BACKGROUND OF THE INVENTION

Sol-gel techniques are commonly used to produce dense thin films in semiconductor fabrication. The word sol-gel, however, does not describe a product but a reaction mechanism whereby a sol may be transformed into a gel. A sol is a colloidal suspension of solid particles in a liquid; one method of forming a sol is through hydrolysis and condensation reactions which cause a multifunctional monomer in a solution to polymerize into relatively large, highly branched particles.

Many monomers suitable for polymerization are metal alkoxides. For example, a tetraethylorthosilicate (TEOS) monomer may be partially hydrolyzed in water by the reaction

$Si(OEt)_4 + H_2O \rightarrow HO-Si(OEt)_3 + EtOH$

Reaction conditions may be controlled such that, on the average, each monomer undergoes a desired number of hydrolysis reactions to partially or fully hydrolyze the monomer; TEOS which has been fully hydrolyzed becomes $Si(OH)_4$. Once a molecule has been at least partially hydrolyzed, two molecules can then link together in a condensation reaction, such as

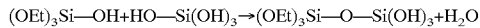

$(OEt)_3Si-OH + HO-Si(OH)_3 \rightarrow (OEt)_3Si-O-Si(OH)_3 + H_2O$ or

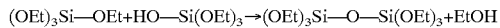

$(OEt)_3Si-OEt + HO-Si(OEt)_3 \rightarrow (OEt)_3Si-O-Si(OEt)_3 + EtOH$ to form an oligomer and liberate a molecule of water or ethanol. The Si—O—Si configuration in the oligomer formed by these reactions has three sites available at each end for further hydrolysis and condensation; thus additional monomers or oligomers can be added to this molecule in a somewhat random fashion to create a highly branched polymeric molecule from literally thousands of monomers.

Through continued reactions, one molecule in the sol may eventually reach macroscopic dimensions so that it forms a network which extends throughout the sol; at this point (called the gel point), the substance is said to be a gel. By this definition, a gel is a substance that contains a continuous solid skeleton enclosing a continuous liquid phase. As the skeleton is porous, a gel can also be described as an open-pored solid structure enclosing a pore fluid. An oligomerized metal alkoxide, as defined herein, comprises molecules formed from at least two alkoxide monomers, but does not comprise a gel.

An ungelled sol may be dip-coated or spin-coated onto a substrate to form a thin film on the order of several microns or less in thickness, gelled, and dried. In practice, such a thin film is subjected to rapid evaporation of volatile components, to the extent that the deposition, gelation, and drying phases may all be taking place at once as the film collapses rapidly to a dense film. Drying by evaporation of the pore fluid produces extreme capillary pressure in the microscopic pores of the wet gel, causing many pores to collapse and the gel to be reduced in volume as it dries, typically by an order of magnitude or more.

A dried gel which is formed by collapsing and densifying a wet gel during drying is termed a xerogel. A thin film xerogel is usually dense, with just a few percent porosity remaining after drying. U.S. patent application Ser. No. 08/247,195 to Gnade, Cho and Smith discloses a process for producing an aerogel thin film on a semiconductor substrate; an aerogel thin film is distinguishable from a xerogel thin film primarily by a manner of drying which largely avoids pore collapse during drying of the wet gel; this results in a substantially undensified thin film which can be fabricated with almost any desired porosity (thin films with greater than 90% porosity have been demonstrated). Such films have been found to be desirable for a low dielectric constant insulation layer in microelectronic applications.

SUMMARY OF THE INVENTION

The present invention provides an aerogel precursor sol and a method for deposition of aerogel thin films, e.g. for microelectronic applications. For such applications, the precise control of film thickness and aerogel density are desirable. Several important properties of the film are related to the aerogel density, including mechanical strength, pore size and dielectric constant. It has now been found that both aerogel density and film thickness are related to the viscosity of the sol at the time it is spun onto a wafer; this presents a problem which was heretofore unrecognized, the problem being that with conventional precursor sols and deposition methods, it is extremely difficult to control both aerogel density and film thickness independently and accurately.

Aerogel thin films may be deposited on patterned wafers, e.g. over a level of patterned conductors. It has now been recognized that sol deposition should be completed prior to the onset of gelation to insure that gaps between such conductors remain adequately filled and that the surface of the gel remains substantially planar. To this end, it is also desirable that no significant evaporation of pore fluid occur during gelation. Unfortunately, it is also desirable that the gel point be reachable as soon after deposition as possible to simplify processing, and the conventional method for speeding gelation of thin films is to allow evaporation to occur. It is recognized herein that a suitable precursor sol for aerogel deposition should allow control of film thickness, aerogel density, gap fill and planarity, and be relatively stable prior to deposition, and yet gel relatively soon after deposition without substantial evaporation.

A method has now been found which allows controlled deposition of aerogel thin films from a multi-solvent precursor sol. In this method, sol viscosity and film thickness may be controlled relatively independently. This allows film thickness to be rapidly changed from a first known value to a second known value which can be set by solvent ratios and spin conditions, thus keeping film thickness largely independent of aerogel density and allowing rapid gelation. However, at the same time, the solid:liquid ratio present in the film at the gel point (and therefore the aerogel density) can be accurately determined in the precursor sol prior to deposition, independent of spin conditions and film thickness.

An aerogel precursor sol particularly suited for microelectronic thin film fabrication is disclosed herein. The aerogel precursor sol comprises an oligomerized metal alkoxide, particulate or colloidal metal oxides, and or organic precursor dispersed in a high volatility solvent and a low volatility solvent, the high volatility solvent having a vapor pressure higher than the vapor pressure of the low volatility solvent. In this sol, the low volatility solvent to metal alkoxide ratio preferably is set to a value capable of forming a gel of a desired density. The high volatility solvent preferably has a ratio to low volatility solvent required to maintain a specified viscosity for the precursor sol.

The high volatility solvent is preferably selected from the group consisting of methanol, ethanol, ketones and combinations thereof As the low volatility solvent generally comprises at least some water, it is preferable that the low volatility components be water miscible. The low volatility solvent is preferably selected from the groups consisting of water, 1-propanol, 2-propanol, 1-butanol, 2-butanol, tert-butanol, 2-pentanol 3-pentanol and combinations thereof.

In another aspect of the invention, a method of forming a porous dielectric on a semiconductor substrate is disclosed. This method may comprise the step of depositing a thin film of an aerogel precursor sol on a semiconductor substrate; the sol comprises an oligomerized metal alkoxide dispersed in a first solvent and a second solvent. The method further comprises preferentially evaporating substantially all of the first solvent from the thin film, preferably without substantial evaporation of the second solvent, and subsequently cross-linking the thin film to form a wet gel having pores arranged in an open-pored structure on the semiconductor substrate. Preferably, the first solvent has a vapor pressure which is higher than the vapor pressure of the second solvent such that it may be removed via differential evaporation rate; this rate may be enhanced by performing the preferential evaporation step in a controlled atmosphere having a partial pressure of the second solvent.

BRIEF DESCRIPTION OF THE DRAWINGS

The present invention, including various features and advantages thereof, may be best understood with reference to the following drawings, wherein.

DETAILED DESCRIPTION OF THE PREFERRED EMBODIMENTS

Typical sol-gel thin film processes produce gels which collapse and density upon drying, thus forming xerogels having only a few percent porosity. Under the uncontrolled drying conditions of xerogel film formation, it has been neither critical nor possible to completely separate the deposition, aggregation, gelation, and drying steps during formation of the thin film, as the entire process may be completed in a few seconds. However, it has now been found that such methods are generally unsuited for depositing high porosity thin films with a controllable low density; because in an aerogel type drying process, the film remains substantially undensified after drying, its final density is largely determined by the solid:liquid ratio in the film at the gel time. It has now been discovered that the following criteria are desirable for aerogel thin film deposition, particularly where the thin film is required to planarize and/or gap fill a patterned wafer:

1) an initial viscosity suitable for spin-on application
2) stable viscosity at deposition
3) stable film thickness at gel time
4) a predetermined solid:liquid ratio at gel time
5) gelation shortly after deposition No prior art precursor sol and method have been found which meet these conditions. However, in accordance with the present invention, it has now been found that a sol prepared with at least two solvents in specific ratios may be used to meet these conditions. The method of depositing and gelling such a precursor sol can be best understood with reference to FIG. 1.

Figure 1:
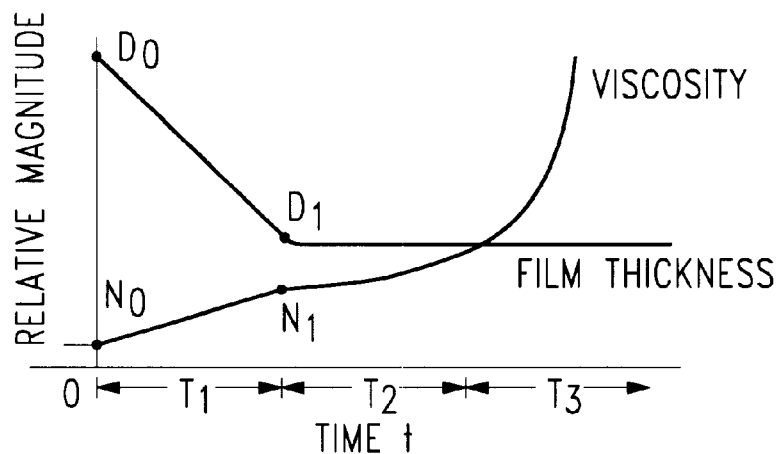
FIG. 1 contains a graph of relative film thickness and relative film viscosity as a function of time for one embodiment of the present invention.

As shown in FIG. 1 for time t=0, a multi-solvent precursor sol may be spun onto a wafer at an initial film thickness $D_0$ and an initial viscosity $\eta_0$. This is preferably done in a controlled atmosphere having a partial pressure of the second solvent which greatly retards evaporation of the second solvent from the wafer. Thus after spin-on application, the first solvent is preferentially removed from the wafer during evaporation time period $T_1$ while the second solvent is maintained, thereby decreasing the film thickness to $D_1$. Viscosity also changes during this time to $\eta_1$, preferably due primarily to the removal of solvent (generally little cross-linking of polymeric clusters in the sol occurs during this time). At the end of $T_1$, substantially all of the first solvent should be evaporated, at which time film thickness should stabilize or proceed to shrink at a much reduced rate, thereby providing a predetermined liquid:solid ratio and thickness for the thin film at gel time.

Time period $T_2$ has the primary purpose of providing separation between the endpoint of evaporation time period $T_1$ and the gel point which occurs during gelation time period $T_3$. Time period $T_2$ may therefore be set to 0, although some finite nonzero period is preferred. Additionally, during time period $T_1$ or $T_2$ a vapor-phase catalyst such as ammonia may be introduced into the controlled atmosphere; this catalyst may diffuse into the thin film, further activating the sol and promoting rapid cross-linking.

Although little or no evaporation preferably takes place during $T_2$, viscosity should begin to increase substantially as cross-linking continues to link polymeric clusters. The viscosity increases as the polymers grow and aggregate, in part because the liquid within a polymeric cluster is not available for flow.

Evaporation near the gel point may result in poor gap-fill and planarity for patterned wafers. Consequently, during gelation time period $T_3$, film thickness is preferably held nearly constant until the gel point has passed by limiting evaporation. Sometime during time period $T_3$, a marked change in viscosity occurs as the sol nears the gel point, where large polymeric clusters finally join to create a spanning cluster which is continuous across the thin film.

Several advantages of the present invention are apparent from FIG. 1. Sol viscosity and film thickness are both allowed to change rapidly, but generally not at the same time. Also, film thickness is changed from a first known value to a second known value which can be independently set by solvent ratios and spin conditions. Using this method, a low viscosity film may be applied, quickly reduced to a preset thickness, and rapidly gelled at a desired density.

Figure 2A:
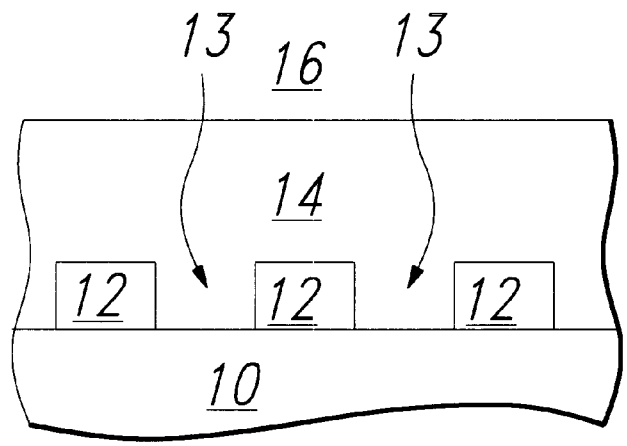
FIGS. 2A–2B contain cross-sections of a semiconductor substrate at several points during deposition of a thin film according to the present invention.

Referring now to FIG. 2A, a semiconductor substrate 10 (typically in wafer form) is shown. Common substrates include silicon, germanium, and gallium arsenide, and the substrate may include active devices, lower level wiring and insulation layers, and many other common structures not shown but known to those skilled in the art. Several patterned conductors 12 (e.g. of an Al-0.5%Cu composition) are shown on substrate 10. Conductors 12 typically run parallel for at least part of their length, such that they are separated by gaps 13 of a predetermined width (typically a fraction of a micron). Both the conductors and gaps may have height-to-width ratios much greater than shown, with larger ratios typically found in devices with smaller feature sizes.

In accordance with one embodiment of the present invention, a stock solution may be prepared by combining TEOS, ethanol, water and HCl in the approximate molar ratio 1:3:1:0.0007 and refluxing this solution for 1.5 hours at 80° C. to form a sol. The sol is further diluted using at least two solvents which differ in volatility, for example, ethanol (v.p.=89 torr @ 32° C.) and 1-butanol (v.p.=31 torr @ 32° C.) in molar ratios of solvent:TEOS of 5:1 and 10:1, respectively to form a multi-solvent precursor sol. Volume ratios of ethanol and 1-butanol may be adjusted to any desired ratio depending on desired film thickness and density.

3–5 ml of this multi-solvent precursor sol may be dispensed at room temperature onto substrate 10, which is then spun at 1500 to 5000 rpm (depending on desired film thickness) for about 5–10 seconds to form sol thin film 14. This is preferably done in a saturated 1-butanol and water atmosphere 16. This permits rapid evaporation of the ethanol from film 14 without substantial evaporation of the 1-butanol and water. An additional advantage of selecting ethanol as a high vapor-pressure solvent in a TEOS-based sol is that ethanol is a reaction product in hydrolysis and condensation; thus simply removing ethanol from the sol may shift the equilibrium point and speed gelation of the film (conversely, the low vapor pressure solvent is preferably not a reaction product, although water is necessary for gelation).

Figure 2B:
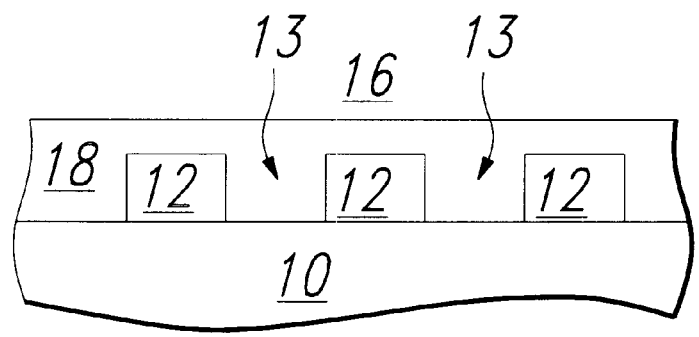

FIG. 2B shows a reduced thickness sol film 18 obtained after substantially all (about 95% or more) of the ethanol has been removed. Film 18 has a known ratio of silicon to pore fluid at the gel point, which is approximately equal to the ratio of TEOS to water and 1-butanol in the as-deposited sol (with minor changes due to continued reactions and incidental evaporation). To the extent that the gel is prevented from collapsing, this ratio will determine the density of the aerogel film which will be produced from the sol thin film.

Film 18 may be dried without substantial densification by one of several methods, including supercritical fluid extraction. However, the preferred method is to surface modify the pore surfaces in the wet gel prior to drying, using a modifying agent such as trimethylchlorosilane, and follow this with slow drying of the film in a controlled atmosphere.

Figure 3:
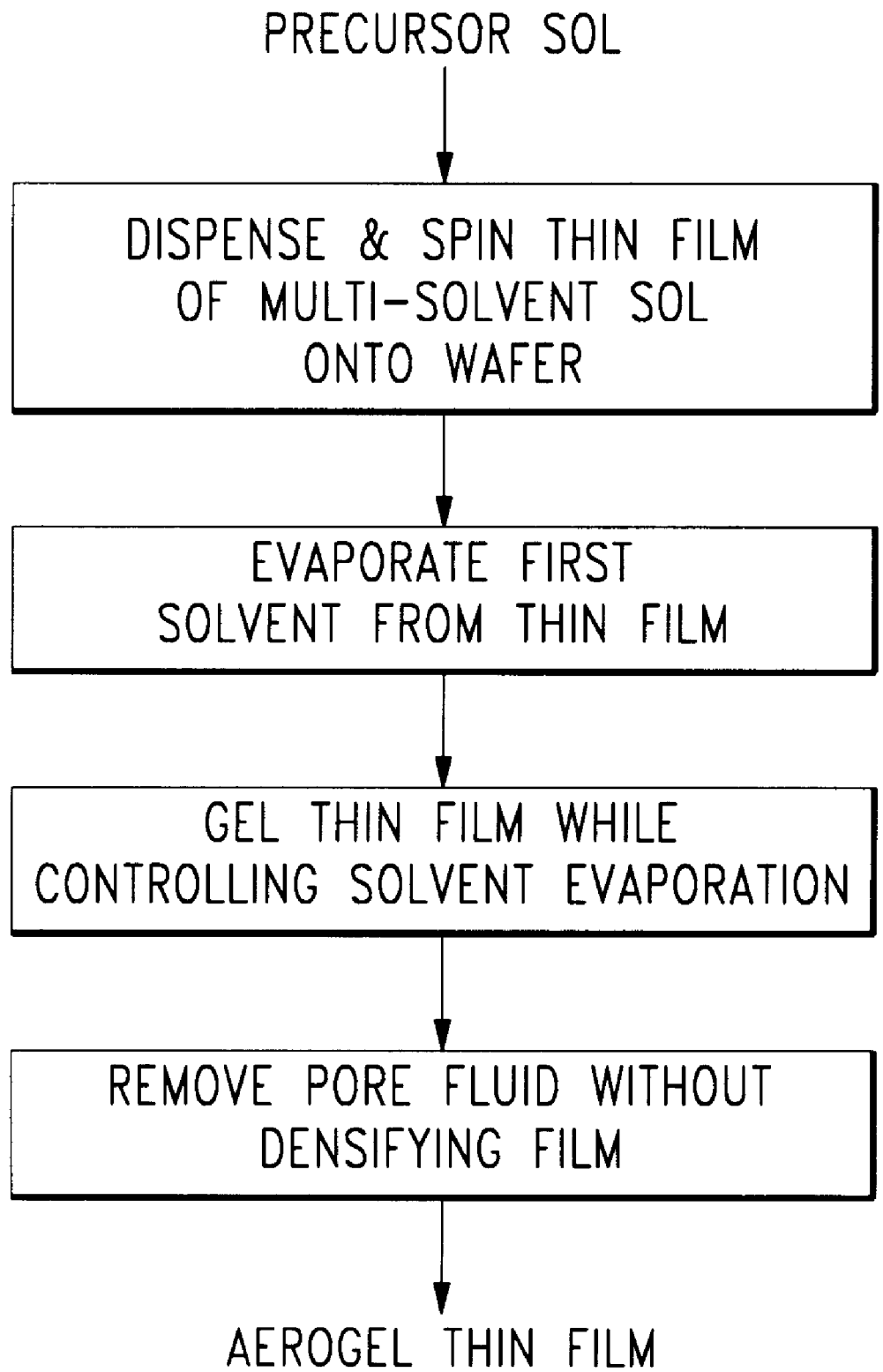
FIG. 3 is a flow chart of a deposition process according to the present invention.

FIG. 3 contains a flow chart of a general method for obtaining an aerogel thin film from a precursor sol according to the present invention. Many of these steps may be modified within the scope of the invention, and other steps can be included to enhance the overall process. For example, the initial thin film may be deposited by other common methods, such as dip-coating or spray-coating instead of spin-coating. Coating and gelation need not be performed in the same chamber or even in the same atmosphere. For instance, coating may be done without a controlled ambient (particularly if the low volatility components do not evaporate rapidly at room conditions), or in an ambient which also prevents evaporation of high volatility components. Also, total pressure and/or temperature may be varied to further control evaporation rates and/or gel time. A post-deposition vapor phase catalyst may be used to speed gelation.

Although TEOS has been used as a representative example, other alkoxides may be used either alone or in combination with TEOS or each other to form a silica network, including tetramethylorthosilicate (TMOS), methyltriethoxysilane (MTEOS), and 1,2-Bis(trimethoxysilyl) ethane (BTMSE). A sol may also include particulate or colloidal silica, may be formed from alkoxides of other metals such as aluminum and titanium, or be formed from organic precursors.

What is claimed is:

1. A method of forming a porous dielectric on a semiconductor substrate, said method comprising the steps of:
   depositing a thin film of an aerogel precursor sol on a semiconductor substrate, said sol comprising a first solvent and a second solvent;
   preferentially evaporating substantially all of said first solvent from said thin film; and
   subsequently cross-linking said sol in said thin film to form a wet gel having pores arranged in an open-pored structure on said semiconductor substrate.

2. The method of claim 1, wherein said first solvent comprises a reaction product of said cross-linking step.

3. The method of claim 1, wherein said second solvent comprises water and an alcohol which is not a reaction product of said cross-inking step.

4. The method of claim 1, wherein said depositing a thin film step is carried out in a controlled atmosphere comprising at least one of a vapor of said first solvent and a vapor of said second solvent.

5. The method of claim 4, wherein said vapor of said second solvent is substantially saturated in said controlled atmosphere.

6. The method of claim 1, wherein said first solvent has a vapor pressure which is at least twice the vapor pressure of said second solvent.

7. The method of claim 1, wherein said depositing a thin film step comprises spin-coating said aerogel precursor sol onto said semiconductor substrate.

8. The method of claim 1, further comprising drying said wet gel without substantial densification of said open-pored structure.

9. A method of forming a porous dielectric on a semiconductor substrate, said method comprising the steps of:
   depositing a thin film of an aerogel precursor sol on a semiconductor substrate, said sol comprising an oligomerized metal alkoxide dispersed in a first solvent and a second solvent, said first solvent having a vapor pressure which is higher than the vapor pressure of said second solvent;
   evaporating substantially all of said first solvent from said thin film while preventing substantial evaporation of said second solvent from said thin film; and
   continuing to prevent substantial evaporation of said second solvent from said thin film until said thin film is polymerized to the gel point;
   whereby a wet gel having pores arranged in an open-pored structure on said semiconductor substrate is formed with a skeletal density determined approximately by the volume ratio of said metal alkoxide to said second solvent in said aerogel precursor sol.

10. A method of forming a porous dielectric on a semiconductor substrate, said method comprising the steps of:
    depositing a thin film of an aerogel precursor sol on a semiconductor substrate, said sol comprising partially hydrolyzed and polymerized tetraethylorthosilicate dispersed in water, ethanol, and a water-miscible solvent having a vapor pressure lower than the vapor pressure of ethanol;

evaporating substantially all of said ethanol from said thin film in an atmosphere which is substantially saturated in water vapor and said water-miscible solvent; and maintaining said atmosphere until said thin film is polymerized to the gel point;

whereby a wet silica gel having pores arranged in an open-pored structure is formed on said semiconductor substrate with a skeletal density determined approximately by the volume ratio of said TEOS to said water-miscible solvent and water in said aerogel precursor sol.

* * * * *